US007379184B2

(12) United States Patent  
Smith et al.

(10) Patent No.: US 7,379,184 B2
(45) Date of Patent: May 27, 2008

(54) OVERLAY MEASUREMENT TARGET

(75) Inventors: Nigel Peter Smith, Hsinchu (TW); Yi-Sha Ku, Hsinchu (TW); Hsin Lan Pang, Hsinchu (TW)

(73) Assignees: Nanometrics Incorporated, Milpitas, CA (US); Industrial Research Technology Institute, Taipei (TW)

( * ) Notice: Subject to any disclaimer, the term of this patent is extended or adjusted under 35 U.S.C. 154(b) by 192 days.

(21) Appl. No.: 11/035,652

(22) Filed: Jan. 13, 2005

(65) Prior Publication Data

US 2006/0151890 A1    Jul. 13, 2006

Related U.S. Application Data

(60) Provisional application No. 60/651,475, filed on Oct. 18, 2004.

(51) Int. Cl.
  *G01B 11/00*   (2006.01)
  *G06K 9/00*    (2006.01)
  *H01L 21/76*   (2006.01)
  *H01L 23/544*  (2006.01)

(52) U.S. Cl. .................. 356/401; 382/151; 438/401; 257/797

(58) Field of Classification Search .............. None
  See application file for complete search history.

(56) References Cited

U.S. PATENT DOCUMENTS

| | | | |
|---|---|---|---|
| 4,149,085 A | 4/1979 | Davis et al. | |
| 5,504,999 A * | 4/1996 | Barr | 33/286 |
| 5,958,632 A | 9/1999 | Sekiguchi | |
| 6,022,650 A * | 2/2000 | Sogawa | 430/22 |
| 6,077,756 A | 6/2000 | Lin et al. | |
| 6,083,807 A | 7/2000 | Hsu | |
| 6,462,818 B1 | 10/2002 | Bareket | |
| 6,486,954 B1 | 11/2002 | Mieher et al. | |
| 6,536,130 B1 * | 3/2003 | Wu et al. | 33/645 |
| 6,571,485 B1 * | 6/2003 | Yu et al. | 33/645 |
| 6,636,311 B1 | 10/2003 | Ina et al. | |
| 6,734,971 B2 | 5/2004 | Smith et al. | |
| 6,916,585 B2 * | 7/2005 | Sreenivasan et al. | 430/22 |
| 7,084,427 B2 * | 8/2006 | Argandona et al. | 257/48 |

(Continued)

FOREIGN PATENT DOCUMENTS

JP   06-216206 A   8/1994

(Continued)

OTHER PUBLICATIONS

"Accent-Caliper élan" printed from www.accentopto.com Aug. 11, 2004.*

(Continued)

*Primary Examiner*—Gregory J. Toatley, Jr.
*Assistant Examiner*—Gordon J. Stock, Jr.
(74) *Attorney, Agent, or Firm*—Silicon Valley Patent Group LLP

(57) ABSTRACT

In an overlay metrology method used during semiconductor device fabrication, an overlay alignment mark facilitates alignment and/or measurement of alignment error of two layers on a semiconductor wafer structure, or different exposures on the same layer. A target is small enough to be positioned within the active area of a semiconductor device combined with appropriate measurement methods, which result in improved measurement accuracy.

27 Claims, 4 Drawing Sheets

U.S. PATENT DOCUMENTS

| | | | |
|---|---|---|---|
| 7,160,657 B2 * | 1/2007 | Smith et al. ............... 430/30 |
| 2003/0027065 A1 | 2/2003 | Fujimoto |
| 2003/0077527 A1 | 4/2003 | Ausschnitt et al. |
| 2003/0095267 A1 | 5/2003 | Mieher et al. |
| 2003/0156750 A1 | 8/2003 | Dajee et al. |
| 2004/0004726 A1 | 1/2004 | Sezginer et al. |
| 2004/0032581 A1 | 2/2004 | Nikoonahad et al. |
| 2004/0038455 A1 * | 2/2004 | Seligson et al. ............ 438/122 |
| 2004/0063009 A1 * | 4/2004 | Phan et al. ............... 430/30 |
| 2004/0066963 A1 | 4/2004 | Hechtl et al. |
| 2004/0126004 A1 | 7/2004 | Kikuchi |
| 2005/0208683 A1 * | 9/2005 | Chen ............... 438/14 |
| 2005/0264783 A1 * | 12/2005 | Smith et al. ............... 355/55 |
| 2006/0115751 A1 * | 6/2006 | Fay et al. ............... 430/22 |
| 2006/0197950 A1 | 9/2006 | Smith et al. |

FOREIGN PATENT DOCUMENTS

| | | | |
|---|---|---|---|
| WO | WO 0129618 A1 * | 4/2001 |
| WO | WO 0198835 A1 * | 12/2001 |
| WO | WO 0199150 A2 * | 12/2001 |
| WO | WO 2004049072 A2 * | 6/2004 |
| WO | WO-2006/044320 A2 | 4/2006 |
| WO | WO-2006/044320 A3 | 4/2006 |
| WO | WO-2006/093722 A2 | 9/2006 |

OTHER PUBLICATIONS

United States Patent and Trademark Office, Combined Search Report and Written Opinion for PCT/US2005/36371, dated Jan. 24, 2007.

Accent—Caliper Élan Tool Brochure located at http://accentopto.com/Accent/productDetailasp?product_idl&detail_id=3, (last visited on Aug, 11, 2004); 1 page.

Attota, R. et al. (2004). "Evaluation of New In-chip and Arrayed Line Overlay Target Designs," *Metrology Inspection and Process Control for Microlithography XVIII*, Bellingham, WA. *Proceedings of SPIE* 5375:395-402.

Combined International Preliminary Report on Patentability mailed on Oct. 16, 2007 & Written Opinion mailed on Sep. 24, 2007 for PCT Application No. PCT/US06/006092 filed on Feb. 22, 2006 by Accent Optical Technologies, Inc., 4 pages.

International Search Report mailed on Sep. 24, 2007 for PCT Application No. PCT/US06/06092 filed on Feb. 22, 2006 by Accent Optical Technologies, Inc., 2 pages.

Attota, R. et al. "Evaluation of New In-chip and Arrayed Line Overlay Target Designs", Metrology Inspection and process Control for Microlithography XVIII, Proceedings of SPIE, 2004, 395-402, vol. 5375, Bellingham, WA, 8 pgs.

* cited by examiner

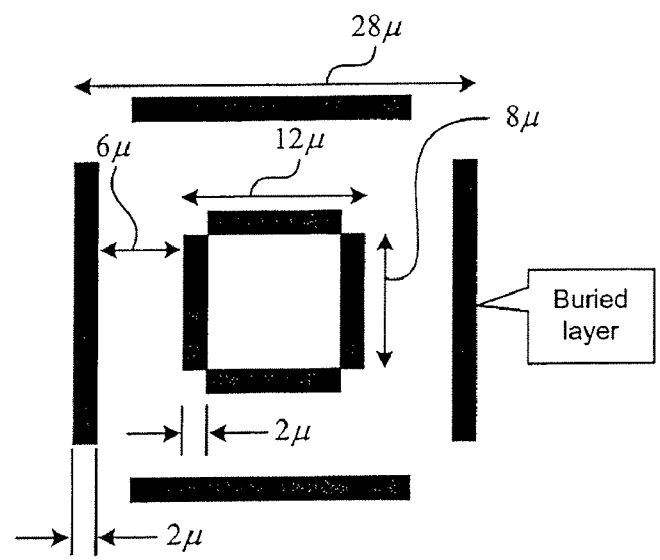
FIG. 1 *Prior Art*
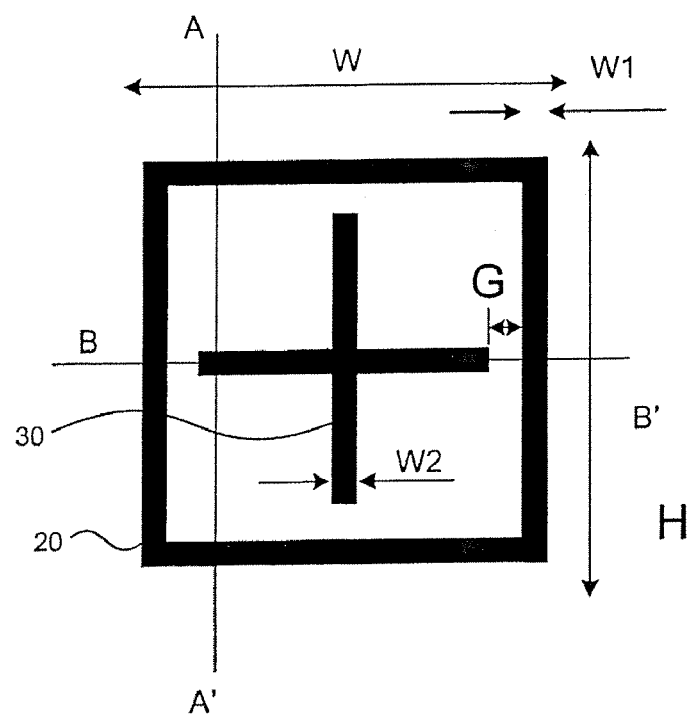
FIG. 2

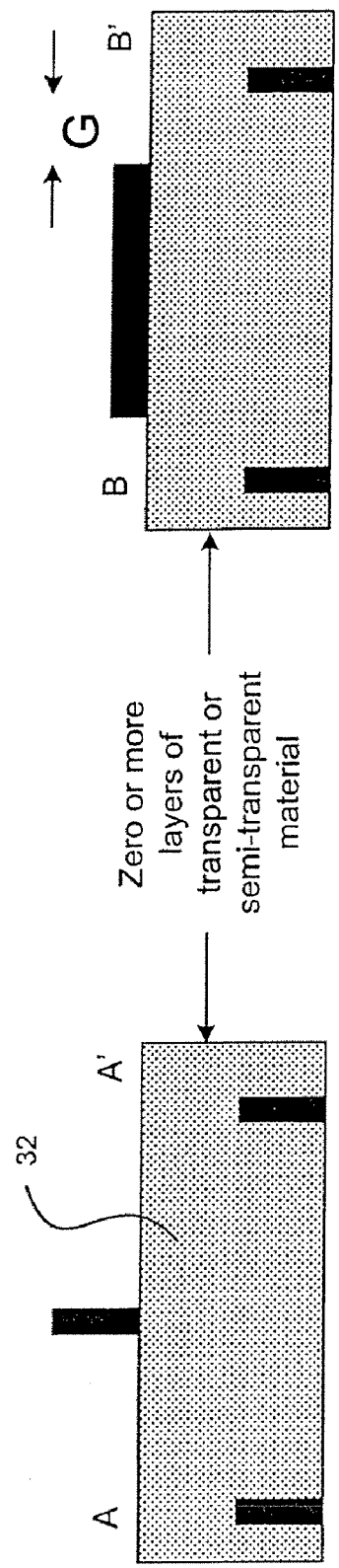

OVERLAY MEASUREMENT TARGET

This Application claims the benefit of U.S. Provisional Patent Application Ser. No. 60/651,475, filed Oct. 18, 2004.

BACKGROUND OF INVENTION

Modern semiconductor devices, such as integrated circuits, are typically fabricated from wafers of semiconductor material. The wafers are fabricated by a succession of patterned layers of semiconductor material. Circuit patterns are fabricated using a variety of long established techniques, for example, lithographic techniques. Precise positioning and alignment during fabrication is important in manufacturing accurate patterns. For example, alignment control of the stepper tool is important in ensuring a consistent process. Statistical stepper alignment methodologies are established, in which statistical techniques are used to determine the alignment of a reticle with a pattern created by or in association with the stepper to facilitate alignment of the stepper. The technique typically uses images generated within the stepper optics, or projected onto the wafer by the stepper optics. Similar statistical methods have been employed to align for example an exposure tool during pattern fabrication.

Although such alignment technology has performed well, and is important in device fabrication, it relates to alignment of fabrication tooling only. This can be a limitation with semiconductor structures having a succession of pattern layers of semiconductor material, where it is desirable to be able to determine the misregistration between fabricated layers themselves.

Overlay metrology in semiconductor device fabrication is used to determine how well one printed layer is overlaid on a previously printed layer. Close alignment of each layer at all points within the device is important for reaching the design goals and hence the required quality and performance of the manufactured device. It is consequently important for the efficiency of the manufacturing process that any alignment error between two patterned layers on a wafer can be measured quickly and accurately. It is similarly important to be able to measure any alignment error between successive exposures in the same layer. Discussion here of two layers applies as well to two exposures in the same layer.

Misregistration between layers is referred to as overlay error. Overlay metrology tools are used to measure the overlay error. This information may be fed into a closed loop system to correct the overlay error.

Current overlay metrology uses optically readable target marks or patterns printed onto layers of a semiconductor wafer during fabrication. The relative displacement of two successive layers is measured by imaging the patterns at high magnification, digitizing the images, and processing the image data using various known image analysis algorithms to quantify the overlay error. Overlay metrology techniques thus involve the direct measurement of misregistration between patterns provided in direct association with each of the layers. In particular, target marks or patterns are developed in or on the surface of each of the layers, rather than being latent images, or images generated within or projected from the optics of an imaging instrument.

The pattern of the target mark may be applied to the wafer by any suitable method. The mark is often preferably printed onto the wafer layers, for example using photolithographic methods. Typically, the same technique is used to apply overlay target marks on each of two or more wafer layers to be tested to enable alignment information representative of the alignment of the layers to be measured. Accuracy of layer alignment should correspond to accuracy of circuit pattern alignment within the fabricated wafer.

Current overlay metrology is normally practiced by printing targets with rectangular symmetry. For each measurement, two targets are printed, one in the current layer and one in a previous layer, or one in association with each pattern in a common layer. The choice of which previous layer to use is determined by process tolerances. The two targets usually have a nominally common center, but are printed with different sizes so that they can be differentiated. Normally, but not always, the target printed in the current layer is the smaller of the two targets. An overlay measurement in such a system is the actual measured displacement of the centers of the two targets.

The size of the targets is currently often designed so that both targets can be imaged simultaneously by a bright-field microscope. Due to imaging considerations, the larger of the two targets is typically about 25 µm square on the outside. This arrangement permits capture of all of the necessary data for the performance of the measurement from a single image. Measurements at a rate of one in every second or less are possible using current technology.

This procedure generally requires that the target and the target image be symmetric, since otherwise there is no uniquely defined center point. Without symmetry, there is an uncertainty in the measurement, which may be more than can be tolerated. Preferred sizes and shapes of current designs of targets to be measured are generally well known. The targets are positioned in the scribe area at the edge of the fabricated circuit.

It is generally highly desirable that the measurement targets maintain axial symmetry about the optical axis of the measurement tool, since accurate measurement requires very close control of image aberrations. In current practice, this can only be achieved for images at or centered about the system axis. In most known systems, measurements are therefore made from the targets by computing a center line for each different target. The overlay measurement is the difference in the center lines. Most of the target designs in general use permit measurement of the vertical and horizontal overlay displacement from a single image.

Measurement errors must be controlled to a very small amount. These errors can be classified as random errors, characterized by determination of measurement precision; and systematic errors, characterized by tool induced errors, tool-to-tool measurement differences and errors introduced by asymmetry in the targets being measured. Successful application of overlay metrology to semiconductor process control generally requires that these errors (combined) be less than 10% of the process control budget. The process control budget is approximately one third of the smallest dimension patterned by the process. The smallest feature sizes being printed in semiconductor device manufacture is currently 65 nm. These features will become progressively even smaller. The overlay measurement error budget is therefore now 3 nm or less, and will become yet smaller in the foreseeable future.

Measurement precision is easily determined by analysis of the variations of repeated measurements. Different forms of precision may be determined by well known appropriate methods, allowing determination of the static, short-term and long-term components of precision.

Determining the contribution of the measurement tool alone to errors is achieved by comparing measurements made with the target in its normal presentation, with a measurement made after rotating the target by 180° with respect to the imaging system. Ideally the measurement will simply change sign. The average of the measurements at 0° and 180° is called Tool Induced Shift (TIS), as is well known to those skilled in the art. TIS is widely accepted as a measure of the tool's systematic error contribution. Measurements of TIS differ from tool to tool and with process layer Subtraction of the estimated TIS error from the measurements allows removal of the TIS error from the measurements, but at the expense of the additional time taken to measure the target twice.

Different tools, even when of the same type, will make slightly different measurements, even after allowing for precision and TIS errors. The magnitude of this error can be determined experimentally by comparing the averages of repeated measurements at 0° and 180° on two or more tools.

The contributions of precision, TIS variation and tool-to-tool differences are normally combined through a root-sum-square product, or alternative appropriate method, to determine the total measurement uncertainty due to the measurement process. The total measurement uncertainty should be less than 10% of the overall overlay budget for the process if the metrology is to have value. Existing measurement tools and procedures achieve a total uncertainty sufficient for current manufacturing techniques but insufficient for the future requirements of smaller feature sizes.

Overlay metrology today is performed almost exclusively by bright-field microscopy. Patterns are fabricated at the edge of the imaged field, in the scribe-line area of the device, specifically for the purpose of metrology. Currently, some device features are smaller than the wavelength of visible light. As a result, the targets generally are significantly larger than these very small features (approximately 25 µm outside dimensions are normal as shown in FIG. 1). The current standard target is large so that the elements are effectively isolated.

There are three sources of error to be considered. The first source of error is imperfection in the manufacture of the target which leads to an uncertainty in its location. An example of this is physical asymmetry of the target, caused perhaps by uneven deposition of a metal film. A second source of error is the difference in the displacement of the two layers at the measurement target and the genuine overlay of the same layers in the device being manufactured. These can arise from errors in the design and manufacture of the reticles used to create the patterns on the wafer, proximity effects in the printing process and distortion of the films after printing by other process steps. A third source of error is shift in the apparent relative position of the two layers due to proximity effects when the measured image is formed. These measurement errors represent a practical limitation of the current state of the art and can cause serious problems in the application of overlay metrology to semiconductor process control.

Error from imperfection in manufacture of the target can sometimes be reduced by fabricating the features in the measured targets from much smaller objects, such as lines or holes. These smaller features are printed at the design rule for the process, currently in the range 0.1-0.2 µm, and are grouped close together. They are too small to be individually resolved by optical microscopes used in overlay metrology tools. The small features are grouped into larger shapes in the pattern of traditional overlay targets. The use of small features avoids some of the mechanisms causing imperfections in the shape of the manufactured targets, in part by taking advantage of the optimization of the manufacturing process for objects of this size and shape.

If the various parts of the measurement target are brought too close together then they will interact during formation of the image in the measurement tool (R Silver et al, SPIE 5038, p. 428). These interactions will introduce an error into the measurement (Smith, Nigel P.; Goelzer, Gary R.; Hanna, Michael; Troccolo, Patrick M., "Minimizing overlay measurement errors", August 1993, Proceedings of SPIE Volume: 1926 Integrated Circuit Metrology, Inspection, and Process Control VII, Editor(s): Postek, Michael T). The effect can be reduced to some extent by enhancing the resolution of the imaging system, for example by increasing the numerical aperture (NA) of the imaging system. But such an increase would also increase the system aberration and hence the magnitude of tool created measurement errors (particularly TIS) to unacceptable levels. In order to maintain acceptable measurement error levels, some prior art systems use microscopes with NA limited to 0.5. Hence the separation of features in the target must be kept at more than 5 µm if proximity effects in the image are to be ignored. The prior art systems do not correct for these proximity effects.

High speed is one of the key advantages of existing overlay metrology practice. Hence, use of repeated measurements is undesirable, unless they can be made without requiring significantly more time. There remains a need for alternative overlay patterns and/or analysis methods which reduce errors and improve accuracy, and without substantial loss of throughput speed.

In order to achieve the very accurate and precise measurement of overlay required as, design rules shrink to 65 nm and below, all of these issues are considered. While in some cases the prior-art method employing measurement of large targets in the scribe line area may be sufficient for process control in the future, the area of applicability will be process dependent and is most likely to occur in the front end of processes where the device stack, and hence the image formation process, is simpler.

SUMMARY OF THE INVENTION

In a first aspect, a novel target design occupies only a few square microns of space. The target is located close to or in the active device area. In-chip target design reduces WIS (wafer or process induced measurement error) and tends to increase measurement accuracy. It has strong correlation of measuring overlay result from optical distortions and process variations between the location of the actual overlay target and the active area. Furthermore, it reduces the difference in the relative dimensions of the overlay targets and actual targets in the active area since the error sets often vary with the size of the features.

Reduction in the size of the measurement targets is desirable. Smaller targets use less of the imaging field of view. Consequently, there is less difference in aberration coefficients at different parts of the image and hence less measurement error due to those aberrations. The width of scribe lines is being reduced at the same time that a greater reliance on metrology is increasing demand for space within them. E-beam tools are replacing photolithography systems for some patterning applications. These tools are unable to create patterns larger than 10 µm in linear dimension. The marks and mark components described here can be made via lithography, photolithography, via e-beam tools, by nano-imprinting (e.g., as described in U.S. Patent Publication No. 2004/0168586, incorporated herein by reference) or in other ways. Any attempt to reduce target size below the (e.g., 25 µm) dimensions in common use by prior art systems, will require treatment of imaging proximity effects if measurement error levels are to be maintained.

In another aspect, measurement error introduced by the placement of the measurement targets within the scribe lines can be removed by placing them within the active area of the wafer. Since this intrudes on the productive portion of the semiconductor device, the size of such patterns is reduced to a target size of about 1 µm square, or smaller.

Very small measurement targets—about 1 µm square or smaller—are also capable of reducing errors due to process induced shape changes, which will effect objects similar in size to the device patterns less than they will affect larger areas. One well-known example of this effect is that chemical-mechanical polishing used to achieve surface flatness prior to lithography steps will cause surface height modification (called "dishing") in large (>1 µm) objects while no such damage is caused to smaller ones.

BRIEF DESCRIPTION OF THE DRAWINGS

FIG. 1 is a top view of a prior art target.
FIGS. 2, 7, 8 and 9 show novel targets.
FIGS. 3, 4, 5 and 6 are side or section views of targets.

DETAILED DESCRIPTION OF THE DRAWINGS

An overlay metrology mark for determining the relative position between two or more layers of a semiconductor structure or between two or more separately generated patterns on a single layer of a semiconductor structure includes a first mark portion 20 associated with a first layer or pattern and a second mark portion 30 associated with a second layer or pattern. As shown in FIG. 2, in plan view, the first mark portion 20 comprises an unfilled rectangle or square of width W and height H and line width W1 (on all sides). The second mark portion 30 is a cross of width W2 which is contained within the rectangle. By design the center of the square 20 and the center of the cross 30 are coincident. Any difference is the overlay error that is to be measured.

One of the two mark portions may or may not be buried beneath one or more layers of semi-transparent or transparent material, as shown by the cross-sections taken along lines A-A' and B-B' of FIG. 2 illustrated in FIGS. 3 and 4, respectively. In the preferred embodiment the first mark portion comprising the rectangle pattern, is buried while the second mark portion, the cross, is patterned in photoresist material and lies on top.

Figure 5:
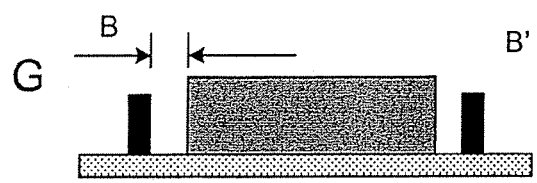
Figure 6:
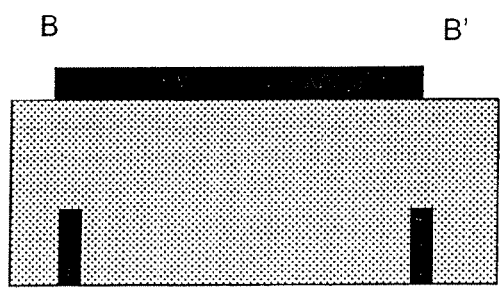
Figure 7:
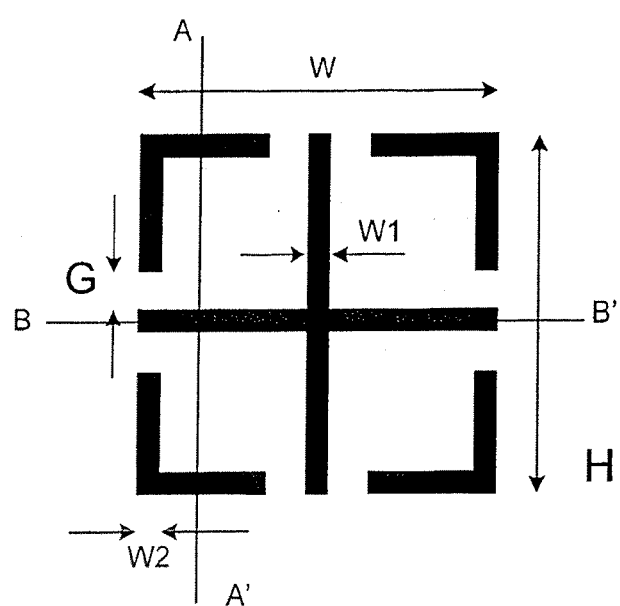

A small gap (G) may be located between the cross and rectangle if required by the manufacturing process for the target, but is not required. As shown in FIG. 5, one instance where a gap may be required is when there is no material covering either layer. In other situations, no gap is required, for example when one layer is buried beneath a film which is then polished flat, as shown in FIG. 6. Where a gap is used, the gap is advantageously located within the outer rectangle instead of between the rectangle and the cross, as shown in FIG. 7.

In the preferred embodiment of the invention the width, W, and height, H, of the surrounding rectangle are the same, as are the lengths of the arms of the enclosed cross (W-2G, H-2G).

Figure 8:
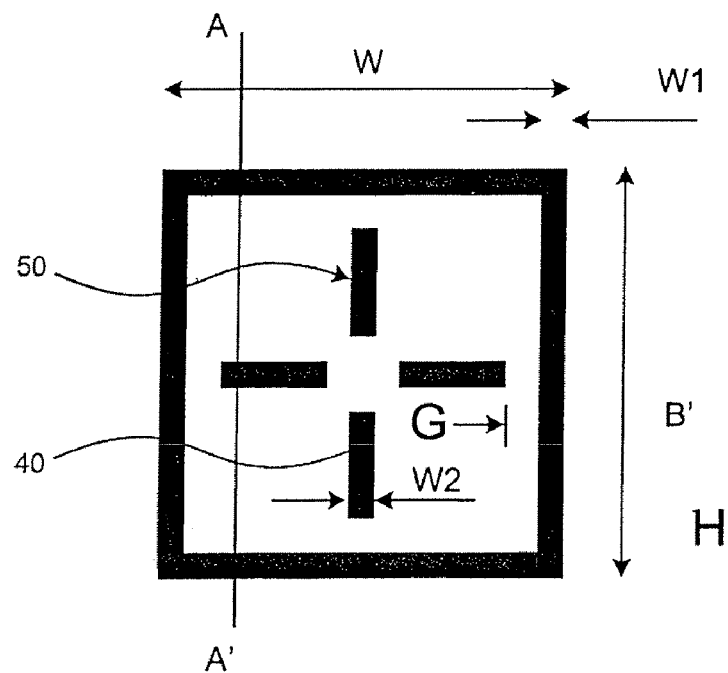
Figure 9:
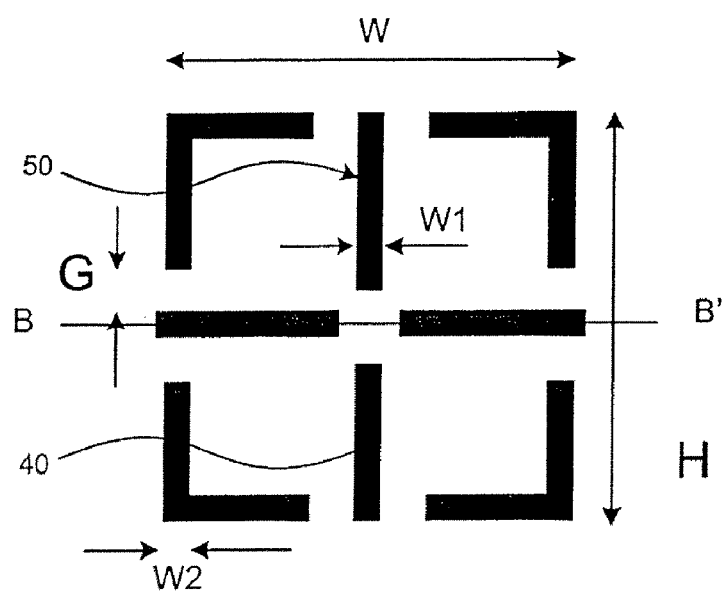

The cross 30 need not be joined at the center. it can be composed of four bars or rectangles 40 arranged on a cross pattern 50, as shown in FIGS. 8 and 9. This arrangement avoids rounding that occurs at the junction of the intersections of the two arms of a completed cross. This is an important refinement if the width W2 of the cross pieces are close to or at the design limits of the lithography process.

The target designs described above retain the central symmetry characteristic of target designs used in the prior art systems. This axial symmetry favors the optical systems used to form images of the targets during measurement. This minimizes the errors arising in the measurement from optical distortion of the image. However, the central group of four bars (or a box) used in the measurement targets of the prior art is collapsed to a cross, facilitating reduction in size of the target.

Although the design may be used to create targets of similar size to those of the prior art (W=H≈25 µm, and W1≈W2≈2 µm), this pattern may be reduced in size to allow its use within the circuit area (W=H≈1 µm, and W1≈W2≈0.1 µm). A reduced sized target following this design may still be used to improve measurement accuracy even if it is placed within the scribe line region. When used in either the scribe region or the active area of the wafer, the novel targets described above avoid the problems discussed above by using design-rule size features distributed over a small area to avoid damage from process steps such as CMP which are optimized for object patterns smaller than 1 µm.

These novel overlay targets can be used in or near the active area. These targets permit measurement from the current to most critical previous layer. In the event of excessive measurement uncertainty, alternative layers may be measured and back-up targets used.

Ideally, measurements within the device area are made using the circuit pattern itself. However, the circuit pattern is designed to achieve the function of the device being manufactured and not to benefit metrology. When imaged in plan view, most relevant sections of the active device area will be patterned in many layers at the same point, and not just the two layer patterns used for overlay measurement. In the general case, the resultant image is too complicated for the available analysis methods for measurements of acceptable quality to be made. It is therefore usually necessary to provide special measurement targets where the image complexity can be controlled so as to permit the measurement tool to extract accurate measurement data.

Suitable small measurement targets have been proposed and demonstrated with the measurements made using a scanning electron microscope (SEM). See Eric P. Solecky, J. Morillo(IBM) *SPIE*5375-06, 2004, US Patent Publication No. 2003/0071997. A SEM has much better resolution than the optical tools used in prior art overlay measurement systems. Hence the image proximity errors discussed above are less of a concern or even irrelevant. However, SEMs have the disadvantage of not being able to image through buried layers. Hence many required overlay measurements cannot be made using this method. Additionally, SEM tools are both more expensive and slower than optical systems, resulting in an undesirable increase in cost per measurement. An advantage of the novel targets described here, is that they enable measurement of suitable overlay targets, including those where one of the layers is buried, with the speed and cost advantages of existing optical measurement equipment.

In order for designers to accept placement of measurement targets within the device area, the new targets must offer improved measurement quality that cannot be obtained in any other way, and the area occupied by these targets must be kept to a minimum. There is no specific upper limit to the acceptable size of any targets used. Targets of 1 µm outer dimension will be more viable than larger ones of 10 µm or more. On the other hand, a 25 µm target as used in prior art systems would not be acceptable within the device area.

Hence, any pattern placed within the device area must be much smaller than those in use before. Interaction effects must also be considered within the algorithms used to perform the measurement if the desired measurement accuracy is to be reached.

The terms in the claims, including the terms rectangle, cross, frame, center line, circle, square, and other similar terms of geometry do not have their usual mathematical dictionary definitions. Rather, they are defined here to have their usual meanings as understood in semiconductor manufacturing metrology. Accordingly, the term rectangle as used here, for example, includes shapes that are not mathematically perfect rectangles, due to manufacturing process or measurement limitations.

Various changes, substitutions and uses of equivalents can of course be added without departing from the spirit and scope of the invention. The invention, therefore, should not be limited, except to the following claims, and their equivalents.

The invention claimed is:

1. An overlay error target mark, comprising:
a first mark portion formed within or on a first layer of an integrated circuit structure;
a second mark portion formed within or on a second layer of the integrated circuit structure;
wherein the first mark portion includes a substantially rectangle or square-shaped frame pattern and the second mark portion includes substantially a cross shaped pattern within the frame pattern of the first mark portion, the cross shaped pattern having four arms radiating from a central point of the cross shaped pattern; and
wherein the position of the first mark portion relative to the position of the second mark portion allows for measurement of overlay error between the first and second layers.

2. The mark of claim 1 wherein the first and second mark portions are printed by a microlithographic process.

3. The mark of claim 1 wherein the centers of the patterns are substantially coincident.

4. The mark of claim 1 where the horizontal and vertical dimensions of the mark are substantially the same.

5. The mark of claim 1 where the width of the frame formed by the first mark portion is at the design rule for the microlithographic process.

6. The mark of claim 1 wherein the rectangle or square-shaped frame pattern, or the cross shaped pattern, or both are formed by smaller pattern sub-elements.

7. The mark of claim 6 where at least one of the sub-elements is shaped substantially as circles, squares, or lines, or a combination of them.

8. The mark of claim 1 wherein the width of the lines in the cross formed by the second mark portion are at the design rule for the microlithographic process.

9. The mark of claim 1, wherein there is a gap between the four arms at the central point of the cross shaped pattern.

10. The mark of claim 1, wherein each of the arms has a width and a length, the length being greater than the width, wherein a first pair of arms are collinear along their lengths and a second pair of arms are collinear along their lengths and the first pair of arms and second pair of arms are orthogonal to each other.

11. A method for measuring overlay error in a semiconductor device, comprising the steps of:
placing a first mark portion in a first active device area on a first layer of the semiconductor device, with the first mark portion including a four-sided frame;
placing a second mark portion in a second active device area on a second layer of the semiconductor device, with the second mark portion including a cross having four arms radiating from a central point of the cross; and
measuring offset between the first mark portion and the second mark portion to determine the overlay error between the first layer and the second layer.

12. The method of claim 11 wherein the width of the frame and cross in the mark pattern are at or near the design rule of the microlithography process.

13. The method of claim 11 wherein either or both of the frame or cross are formed by sub-elements patterned at or near the design rule of the microlithography process.

14. The method of claim 11, wherein there is a gap between the four arms at the central point of the cross.

15. The method of claim 11, wherein each of the arms has a width and a length, the length being greater than the width, wherein a first pair of arms are collinear along their lengths and a second pair of arms are collinear along their lengths and the first pair of arms and second pair of arms are orthogonal to each other.

16. An overlay metrology mark formed within or on a semiconductor wafer, comprising:
a first mark portion formed within or on a first layer of an integrated circuit structure;
a second mark portion within or on a second layer of the integrated circuit structure;
wherein the first mark portion comprises a rectangle or square-shaped frame pattern;
wherein the second mark portion comprises four rectangles positioned in a cross shaped pattern contained within the frame pattern defined by the first mark portion, the four rectangles radiating from a central point of the cross shaped pattern; and
wherein a gap between the rectangles is sufficiently large enough to avoid substantial changes to the rectangular shape by the lithographic printing process.

17. The mark of claim 16, wherein each of the rectangles has a width and a length, the length being greater than the width, wherein a first pair of rectangles are collinear along their lengths and a second pair of rectangles are collinear along their lengths and the first pair of rectangles and second pair of rectangles are orthogonal to each other.

18. A method for measuring overlay error in a semiconductor device, comprising:
placing a first mark portion in a first active device area on a first layer of the semiconductor device;
placing a second mark portion in a second active device area of a second layer of the semiconductor device;
wherein the first mark portion comprises a rectangle or square-shaped frame and the second mark portion comprising four rectangles positioned in a cross shape contained within the frame defined by the first mark potion, the four rectangles radiating from a central point of the cross shape;
wherein the largest dimension of the first or the second mark portion is less than 10 microns; and
measuring offset between the first mark portion and the second mark portion to determine the overlay error.

19. The method of claim 18 wherein there is a gap between the rectangles at the central point of the cross shape.

20. The method of claim 18 wherein the largest dimension of the first mark portion is 1 micron or less.

21. The method of claim 18 wherein the first and second mark portions are printed by a microlithography process.

22. The method of claim 19 wherein the rectangle-shaped frame pattern, or the cross shape pattern, or both are formed by smaller pattern sub-elements.

23. The method of claim 22 wherein at least one of the sub-elements is shaped substantially as circles, squares, or lines, or a combination of them.

24. The method of claim 18, wherein each of the rectangles has a width and a length, the length being greater than the width, wherein a first pair of rectangles are collinear along their lengths and a second pair of rectangles are collinear along their lengths and the first pair of rectangles and second pair of rectangles are orthogonal to each other.

25. A method for measuring overlay error in a semiconductor device, comprising:
placing a first mark portion in a first active device area on a first layer of the semiconductor device;
placing a second mark portion in a second active device area of a second layer of the semiconductor device;
with the first and second mark portions forming a target 1 square micron or smaller;
optically imaging and measuring an offset between the first mark portion and the second mark portion to determine the overlay error.

26. The method of claim 25, wherein the first mark portion comprises a rectangle or square-shaped frame and the second mark portion comprising four rectangles positioned in a cross shape contained within the frame defined by the first mark potion, wherein the four rectangles radiating from a central point of the cross shape; and wherein there is a gap between the rectangles at the central point of the cross shape.

27. The method of claim 26, wherein each of the rectangles has a width and a length, the length being greater than the width, wherein a first pair of rectangles are collinear along their lengths and a second pair of rectangles are collinear along their lengths and the first pair of rectangles and second pair of rectangles are orthogonal to each other.

* * * * *